(12) United States Patent
Lawton et al.

(10) Patent No.: US 10,054,631 B2
(45) Date of Patent: Aug. 21, 2018

(54) ELECTRICAL ARCING DETECTOR FOR ARCING AT SERIES ELECTRICTRICAL CONNECTION

(71) Applicant: Advent Design Corporation, Bristol, PA (US)

(72) Inventors: Thomas Alan Lawton, Newtown, PA (US); Ralph Nicolas Amato, Branchville, NJ (US); Richard Hughes Hewitt, Ewing, NJ (US)

(73) Assignee: Advent Design Corporation, Bristol, PA (US)

( * ) Notice: Subject to any disclaimer, the term of this patent is extended or adjusted under 35 U.S.C. 154(b) by 317 days.

(21) Appl. No.: 15/013,631

(22) Filed: Feb. 2, 2016

(65) Prior Publication Data

US 2017/0082677 A1  Mar. 23, 2017

Related U.S. Application Data

(60) Provisional application No. 62/221,160, filed on Sep. 21, 2015.

(51) Int. Cl.
| | |
|---|---|
| *G01R 31/04* | (2006.01) |
| *G01R 31/14* | (2006.01) |
| *G01R 22/00* | (2006.01) |
| *G01R 31/12* | (2006.01) |
| *G01R 22/06* | (2006.01) |
| *H02H 1/00* | (2006.01) |

(Continued)

(52) U.S. Cl.
CPC ............ *G01R 31/14* (2013.01); *G01R 22/00* (2013.01); *G01R 22/068* (2013.01); *G01R 31/045* (2013.01); *G01R 31/1227* (2013.01); *H02H 1/0015* (2013.01); *G01R 1/00* (2013.01); *H02H 1/00* (2013.01); *H02J 1/00* (2013.01)

(58) Field of Classification Search
CPC ................ G01R 1/00; H02H 1/00; H02J 1/00
See application file for complete search history.

(56) References Cited

U.S. PATENT DOCUMENTS

| | | |
|---|---|---|
| 3,914,657 A | 10/1975 | Melanson |
| 4,348,668 A | 9/1982 | Gurr et al. |

(Continued)

OTHER PUBLICATIONS

Wikipedia, "Smart Meter", printed Jun. 8, 2015, 20 pages.
(Continued)

*Primary Examiner* — Jermele M Hollington
*Assistant Examiner* — Temilade Rhodes-Vivour
(74) *Attorney, Agent, or Firm* — Clement A. Berard, Esq.; Dann, Dorfman, Herrell & Skillman, PC (57) ABSTRACT

An electrical arc detector for a series electrical connection as may be associated with an electric meter may comprise: an arc detector housing; a source of electrical power; a de-tuned resonant tank circuit configured to receive a magnetic field and/or an electric field generated by an electrical arc at a series electrical connection; an electrical detector for detecting signals generated in the de-tuned resonant tank circuit responsive to the magnetic field and/or the electric field generated by an electrical arc; and an output device responsive to the electrical detector and configured to provide a human perceivable indication of detection of an electrical arc at the series electrical connection.

11 Claims, 4 Drawing Sheets

(51) Int. Cl.
*H02J 1/00* (2006.01)
*G01R 1/00* (2006.01)

(56) References Cited

U.S. PATENT DOCUMENTS

| | | | | |
|---|---|---|---|---|
| 4,428,019 | A | * | 1/1984 | Howell .................... H02H 3/33 361/113 |
| 5,017,877 | A | | 5/1991 | Haus, Jr. |
| 5,121,282 | A | | 6/1992 | White |
| 5,185,685 | A | | 2/1993 | Tennies et al. |
| 5,185,686 | A | | 2/1993 | Hansen et al. |
| 5,185,687 | A | | 2/1993 | Beihoff et al. |
| 5,206,596 | A | | 4/1993 | Beihoff et al. |
| 5,208,542 | A | | 5/1993 | Tennies et al. |
| 5,321,397 | A | | 6/1994 | Stone |
| 5,473,322 | A | | 12/1995 | Carney |
| 5,477,150 | A | * | 12/1995 | Ham, Jr. ............... G01R 23/165 324/501 |
| 5,729,145 | A | | 3/1998 | Blades |
| 6,772,077 | B1 | * | 8/2004 | Parker .................... G01R 31/12 361/63 |
| 8,847,576 | B1 | | 9/2014 | Hannam et al. |
| 8,947,246 | B2 | | 2/2015 | Aiken |
| 9,594,107 | B1 | | 3/2017 | Lawton et al. |
| 2001/0033468 | A1 | | 10/2001 | Macbeth |
| 2004/0124785 | A1 | * | 7/2004 | Alexandrov ....... H05B 41/2813 315/291 |
| 2006/0190140 | A1 | | 8/2006 | Soni |
| 2010/0036624 | A1 | | 2/2010 | Martin et al. |
| 2010/0046126 | A1 | * | 2/2010 | Elms ..................... H01H 83/04 361/42 |
| 2012/0217970 | A1 | * | 8/2012 | MacBeth ............... G01R 31/14 324/424 |
| 2013/0335105 | A1 | | 12/2013 | Washiro |
| 2014/0327449 | A1 | | 11/2014 | Shuey et al. |

OTHER PUBLICATIONS

Alex Newman, "In U.S. and Canada, "Smart Meter" Fires Spark Alarm", Aug. 13, 2014, 4 pages.
EMS Safety Network, "Smart Meter Fires and Explosions", printed Aug. 13, 2015, 83 pages.
Restrepo, Carlos E., "Arc Fault Detection and Discrimination Methods", The 53rd IEEE Holm Conference, 2007: 115-122, 8 pages.

* cited by examiner

ELECTRICAL ARCING DETECTOR FOR ARCING AT SERIES ELECTRICTRICAL CONNECTION

This Application claims the benefit of the priority of U.S. Provisional Patent Application No. 62/221,160 entitled "ELECTRIC METER AND CONTACT ARCING DETECTOR, AND ARCING DETECTOR THEREFOR" which was filed on Sep. 21, 2015, and which is hereby incorporated herein by reference in its entirety.

The present invention relates to a detector of electrical arcing at a series electrical connection.

Revenue-grade socket electric meters, used in approximately 200 million plus locations in the United States, can possibly have dangerously arcing connections between the meter connections ("stabs") of the electric meter and the socket connections ("jaws") of the meter socket that connect to it. A condition where the stab-to-jaw connection is arcing without causing any easily detectable power problems on the site is dangerous because the arcing connection can heat up to a point of causing a fire, yet the arcing connection does not necessarily cause a condition which is easily detectable by commonly used fault-detection methods, such as fuses and circuit breakers which respond to over-current conditions or ground fault detectors which respond to current flowing from a supply to a safety ground.

Given the large number of these meters in use, the potential harm from electrical arcing at connections is widespread, yet at the same time such high volume usage calls for an extremely low cost detection device and method so as to be affordable on such a large scale.

Such electric meters, which are widely employed to indicate usage of electrical power by a consumer or customer of an electric utility supplier, are typically plug-in devices that are plugged in to a meter socket which is typically mounted in an enclosure on a building or other structure whereat electrical power is consumed. The meter socket typically includes plural metal "jaws" which are female electrical contacts that are embedded or otherwise attached to an insulating socket base in a standardized pattern. A typical meter socket for single phase or two phase power can have four jaws for providing two pairs of electrical connections from the socket to the meter, one pair for carrying current from the utility supply to the meter and a second pair for carrying electrical current from the meter to the electrical panel and wiring of the consumer.

The electric meter typically includes plural metal "stabs" which are male electrical contacts that are embedded in or otherwise attached to an insulating base of the electric meter in the standardized pattern, so that the electric meter conveniently plugs into the meter socket and is likewise removable therefrom. A typical electric meter for single phase or two phase power can have four stabs for providing two pairs of electrical connections between the meter and the socket, one pair for carrying current from the utility supply to the meter and a second pair for carrying electrical current from the meter to the electrical panel and wiring of the consumer.

Typical residences have 100 ampere, or 150 ampere, or 200 ampere electrical service and so substantial electrical current typically flows through each stab-to-jaw connection. Practically, the electrical contact between a jaw and a stab departs from the ideal, e.g., in that complete electrical contact over the intended surface area may be lacking, e.g., due to misalignment, wear, relaxation of the metal jaw, dirt and/or corrosion, and the like. These manifest as, e.g., an increased electrical resistance of the connection and/or a gap across which the current flows by arcing, which results in electrical heating at the connection. Under high current conditions, such heating can increase temperature sufficiently to lead to fire. Many instances of electrical meter fires have been reported. (See the web page at: http://emfsafetynetwork.org/smart-meters/smart-meter-fires-and-explosions/).

While some schemes to detect such contact arcing have been proposed, those are understood to be complex and therefore tend to add significant complexity and cost to each electric meter. Patents and patent applications exist which describe detecting arcing via detection of RF radio wave emissions, yet those patents require complicated methods of detection and discrimination. For example, U.S. Published Patent Application 2014/0327449A1 to Elster describes arc detection using a sophisticated spread-spectrum radio transceiver used in remote meter reading systems. U.S. Pat. No. 5,729,145 to Blades describes a complicated system of correlating RF detection with instantaneous line voltage in order to discriminate between arcing and other radio noise.

Applicant believes there is a need for a simpler contact arc detector that can detect arcing at the stab-to-jaw connections of an electric meter and signal a need for an action that is, e.g., intended to prevent a fire or alert personnel, while being relatively small, so as to be easily and inexpensively made part of an electric meter or carried.

Accordingly, an electrical arc detector for a series electrical connection as may be associated with an electric meter may comprise: an arc detector housing; a source of electrical power; a de-tuned resonant tank circuit configured to receive a magnetic field and/or an electric field generated by an electrical arc at a series electrical connection; an electrical detector for detecting signals generated in the de-tuned resonant tank circuit responsive to the magnetic field and/or the electric field generated by an electrical arc; and an output device responsive to the electrical detector and configured to provide a human perceivable indication of detection of an electrical arc at the series electrical connection.

Accordingly, an electric meter contact arcing detector that may be mountable to an electric meter base having a plurality of contacts for connecting to plural contacts of an electric meter socket may comprise: a de-tuned resonant tank circuit configured to receive a field generated by an electrical arc at a contact; an electrical detector for detecting signals generated in the de-tuned resonant tank circuit responsive to an electrical arc; and an output device responsive to the electrical detector. Thus, an electrical arc at a contact may be detected and cause the output device to respond thereto.

An electric meter and contact arc detector may comprise: an electric meter base having contacts for connecting to an electric meter socket; a metering device; and a contact arc detector that may comprise: a de-tuned resonant tank circuit configured to receive a field generated by an electrical arc at a contact; an electrical detector for detecting signals in the de-tuned resonant tank circuit responsive to an electrical arc; and a disconnect device configured to interrupt an electrical connection to one or more of the contacts. Thus, electrical arc at a contact may be detected and cause interruption of an electrical connection to a contact.

In summarizing the arrangements described and/or claimed herein, a selection of concepts and/or elements and/or steps that are described in the detailed description herein may be made or simplified. Any summary is not intended to identify key features, elements and/or steps, or essential features, elements and/or steps, relating to the claimed subject matter, and so are not intended to be limiting and should not be construed to be limiting of or defining of the scope and breadth of the claimed subject matter.

BRIEF DESCRIPTION OF THE DRAWING

The detailed description of the preferred embodiment(s) will be more easily and better understood when read in conjunction with the FIGURES of the Drawing which include.

In the Drawing, where an element or feature is shown in more than one drawing figure, the same alphanumeric designation may be used to designate such element or feature in each figure, and where a closely related or modified element is shown in a figure, the same alphanumerical designation may be primed or designated "a" or "b" or the like to designate the modified element or feature. Similar elements or features may be designated by like alphanumeric designations in different figures of the Drawing and with similar nomenclature in the specification. As is common, the various features of the drawing are not to scale, the dimensions of the various features may be arbitrarily expanded or reduced for clarity, and any value stated in any Figure is by way of example only.

DESCRIPTION OF THE PREFERRED EMBODIMENT(S)

The present arrangement detects arcing at an electric contact utilizing a relatively simple broadband detector circuit installed within close proximity of the meter stabs, e.g., in use, the stab-to-jaw connections between the electric meter and a meter socket. One example embodiment of such a detector circuit is described herein, and other, perhaps simpler, embodiments may be possible. Because this detector circuit is so simple, it can be made very small physically, and thus can be placed in relatively close proximity to where the arcing may occur, e.g., at the stabs. With the detector circuit so close to the potential arcing location, more sophisticated methods of discrimination are not necessary, because the signal generated by the contact arcing falls off quite rapidly with increasing distance between the location of the arc and that of the arc detector circuit.

This arrangement allows for the detection/discrimination process to be extremely simple due to physical placement of the detector close to the location of potential arcing. Thus, the circuit doesn't require that the emissions from arcing be a radio wave (using the common definition of a radio wave as being a disturbance where the respective amplitudes of electric and magnetic fields are proportional to one another related by the impedance of free space), although the detector operates over a range of frequencies generally considered to be in a radio frequency (RF) band. The close proximity placement of the arcing detector to the location of potential arcing allows electrical and/or magnetic energy from the arcing to be coupled into a de-tuned inductor/capacitor tank circuit, e.g., by simple transformer action with the inductor and circuit wiring in the case of coupling via a magnetic field created by the arcing, or by capacitive coupling with the capacitor and circuit wiring in the case of coupling via an electric field created by the arcing, or by other means.

Typically, the harmful effects of electric meter contact arcing will take more than 20-30 seconds of continuous arcing to materialize as a dangerous condition, e.g., in the form of melting of meter components, and/or of out-gassing and/or burning of meter components, due to heat created by the arcing. Therefore, this arrangement utilizes a straight forward timing law, which may be implemented in any number of different ways, e.g., by a microcomputer or microcontroller and/or with timing networks, counters and other appropriate electronic circuits.

Figure 1:
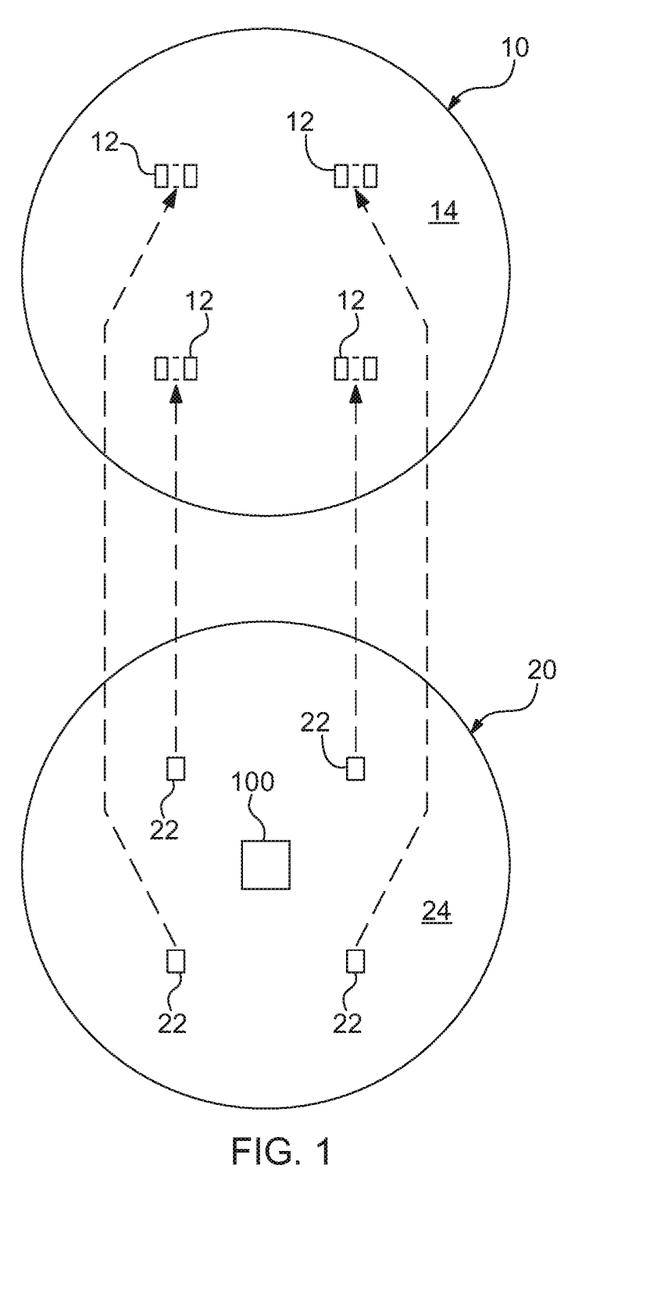
FIG. 1 is a schematic diagram illustrating elevation views of an example meter socket and of an example embodiment of an electric meter including a contact arc detector.
Figure 2:
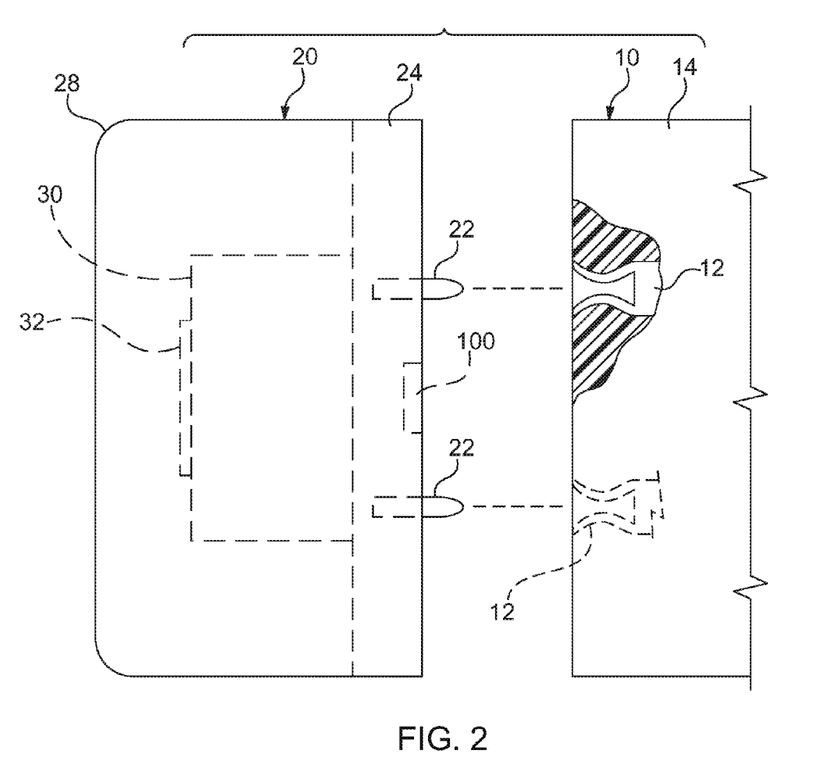
FIG. 2 is a side view of an example embodiment of an electric meter including a contact arc detector proximate an example meter socket.
Figure 2A:
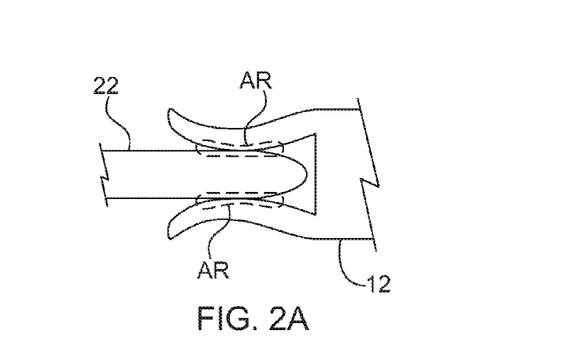
FIG. 2A is an enlarged view of a stab to jaw connection.

FIG. 1 is a schematic diagram illustrating elevation views of an example meter socket 10 and of an example embodiment of an electric meter 20 including a contact arc detector 100, FIG. 2 is a side view of an example embodiment of an electric meter 20 including a contact arc detector 100 proximate an example meter socket 10, and FIG. 2A is an enlarged view of an example connection of a stab contact 22 of an electric meter 20 to a jaw contact 12 of a meter socket 10. Meter socket 10 includes a typically circular insulating base 14 in which are embedded or otherwise attached a plurality of electrical contacts 12 each of which is usually a female contact member referred to as a jaw 12 because it has plural flexible contact extensions into which a male contact member 22 may be inserted. Jaws 12 are typically in a standardized pattern with standardized spacing. In a typical installation, meter socket 10 is installed, e.g., in a metal electrical box having a sealable interface for receiving an electric meter 20 with protection against weather and security against tampering, that is mounted on a building or other structure or support.

Electric meter 20 includes a typically circular insulating base 24 in which are embedded or otherwise attached a plurality of electrical contacts 22 each of which is usually a male contact member 22 referred to as a stab 22 because it has a male contact member 22 which may be inserted into a female contact member 12. Stabs 22 are typically in a standardized pattern with standardized spacing that corresponds to the pattern and spacing of contacts 12 of meter socket 10. In a typical installation, electric meter 20 is installed into a metal electrical box containing a meter socket 10 and the metal electrical box provides a sealable interface for protection against weather and for security against tampering with electric meter 20.

Electrical contact arc detector 100 is typically and preferably mounted near the insulating base 24 of electric meter 20 in relatively close proximity to stabs 22, e.g., in a region generally centrally located within the pattern of stabs 22. Insulating meter base 24 is typically circular and of substantially the same size as is socket base 14. Meter base 24 also typically supports a metering device 30 having a meter readout 32.

Metering device 30 may be, e.g., an electro-mechanical metering device 30 driven by the power passing through meter 20 and having a mechanical dial read out 32 or an electronic readout 32, or may be, e.g., an electronic metering device 30 having an electronic readout 32 or having a transmitter for transmitting metering and/or status information to a utility via a communication link or network. The latter more modern type of electric meter 30 is typically referred to as a "smart meter" and includes a microprocessor or micro-controller that digitally monitors and meters electric power usage and status, and that typically can actuate a disconnect device, e.g., an electro-mechanical or an electronic disconnect device, to disconnect the power supply mains from the utilization wiring and equipment at that location, e.g., by interrupting the electrical power connection to one or more of stabs 22 of meter 20.

With stabs 22 inserted into jaws 12, the contact extensions of jaws 12 are urged outwardly, e.g., apart, by stab 22 thereby to create pressure between jaw 12 and stab 22 for making a better electrical connection over the area AR of physical contact between the surfaces of jaw 12 and stab 22. But neither the contact area AR nor the electrical connection is perfect, e.g., due to surface imperfections, tarnish, corrosion, foreign matter and the like, and so electrical arcing will eventually occur in region AR. While the electric and magnetic fields generated by the electrical current flowing through the connection of jaws 12 and stab 22 are at the power line frequency, the electric and magnetic fields generated by the electrical arcing are over a broad band of frequencies, including radio frequencies that are at least in part within the bandwidth of electrical arc detector 100.

Figure 3:
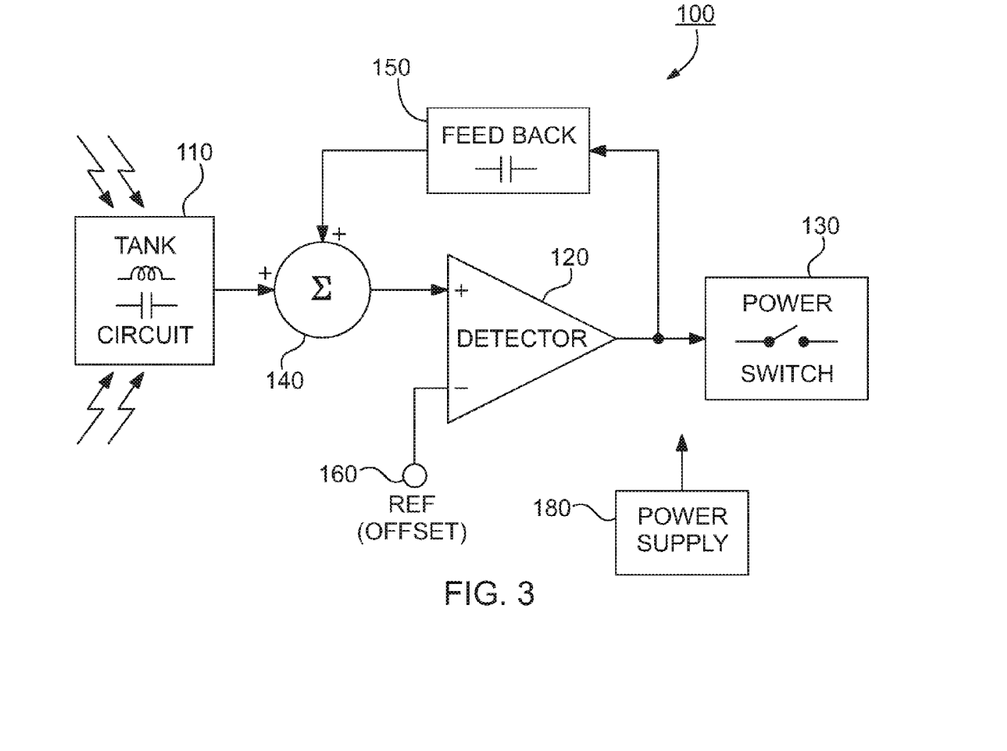
FIG. 3 is a schematic diagram of example embodiment of an electric meter contact arc detector.

FIG. 3 is a schematic diagram of example embodiment of an electric meter contact arc detector 100. Therein, the electric and magnetic fields generated by the electrical arcing (indicated by the four jagged arrows) impinge upon a resonant electrical circuit 110, e.g., a so-called L-C tank circuit, to produce a voltage which is coupled via summing node 140 to detector 120, e.g., to the "+" input thereof. A reference level or offset 160 is applied to the other input of detector 120, e.g., to the "−" input thereof, to establish a minimum or threshold level below which detector 120 does not respond and above which detector 120 produces a detection signal at its output.

When detector 120 responds to the electric and magnetic fields generated by the electrical arcing, its output signal may be applied for two purposes. Firstly, the output signal from detector 120 may directly or indirectly cause a power switch 130, e.g., a contactor or circuit breaker, to be actuated to disconnect or interrupt the power supply mains received at one or more of stabs 22, thereby to disconnect electrical power flowing to the utilizing load and to extinguish the current flow that is producing electrical arcing.

The output signal from detector 120 is also applied to feedback network 150 and through that feedback network 150 to the + input of detector 120 via summing node 140, thereby to provide positive feedback to cause detector 120 to remain in the arc detecting condition, at least temporarily. Feedback network 150 preferably is AC coupled and has a time constant that controls the time that detector 120 remains in the arc detecting condition so that its output is of sufficient duration to directly or indirectly cause power switch 130 to activate and disconnected electrical power, thereby to remove electrical power from the supply mains, or to satisfy another utilization condition.

Alternatively, and usually preferably, the arc detector 100 acts indirectly in that it provides an output signal of sufficient duration to indicate an occurrence of electrical arcing to the micro-controller or microprocessor of the metering device 30 of electric meter 20. That micro-controller or microprocessor would then, if the extent and/or duration of electrical arcing exceeds a predetermined limit or threshold, actuate the disconnect switch of the electric meter 20 if the meter manufacturer and/or utility has provided and enabled that functionality.

Because detection circuit 100 is relatively simple and does not filter out or correlate any false signals, e.g., signals from AMI transmitters or other RF sources, it is preferred that such functionality be implemented by the micro-controller or microprocessor of the metering device 30 of electric meter 20 in the manner determined by the utility utilizing such meter. It is noted that different utilities will likely have different limit and/or threshold criteria for different types of electric meters, for electric meters from different manufacturers, and for their determined level of risk and experience relating to electric meters and their problems, including electrical arcing and possibly fires resulting from electrical arcing of electric meters.

Typically, in a smart meter 20, actuation of disconnecting power switch 130 is detected by the microprocessor or micro-controller thereof and is communicated by electric meter 20, e.g., by a transmitter and/or modem associated with metering device 30, to a utility. Power may be reconnected by resetting disconnecting power switch, e.g., manually at the location of meter 20, by remote control from the utility utilizing the microprocessor or micro-controller of meter 20, or by the microprocessor or micro-controller of meter 20 monitoring conditions at meter 20 and initiating the resetting of switch 130.

Electrical power for arc detector 100 is provided by power supply 180 which may take one of many forms. In its simplest form, power supply 180 may be a battery. In another form, power supply 180 may be or may be part of a power supply that is part of a smart meter 20 or another electronic meter 20, e.g., that is part of metering device 30 thereof. Typically, power supply 180 derives electrical power from the power supply mains received via stabs 22 and may include, among other things, a rectifier, transformer, and/or DC converter. Even such DC converters may include a back up battery power source for times when there is an outage or other loss of power received from power supply mains.

Figure 4:
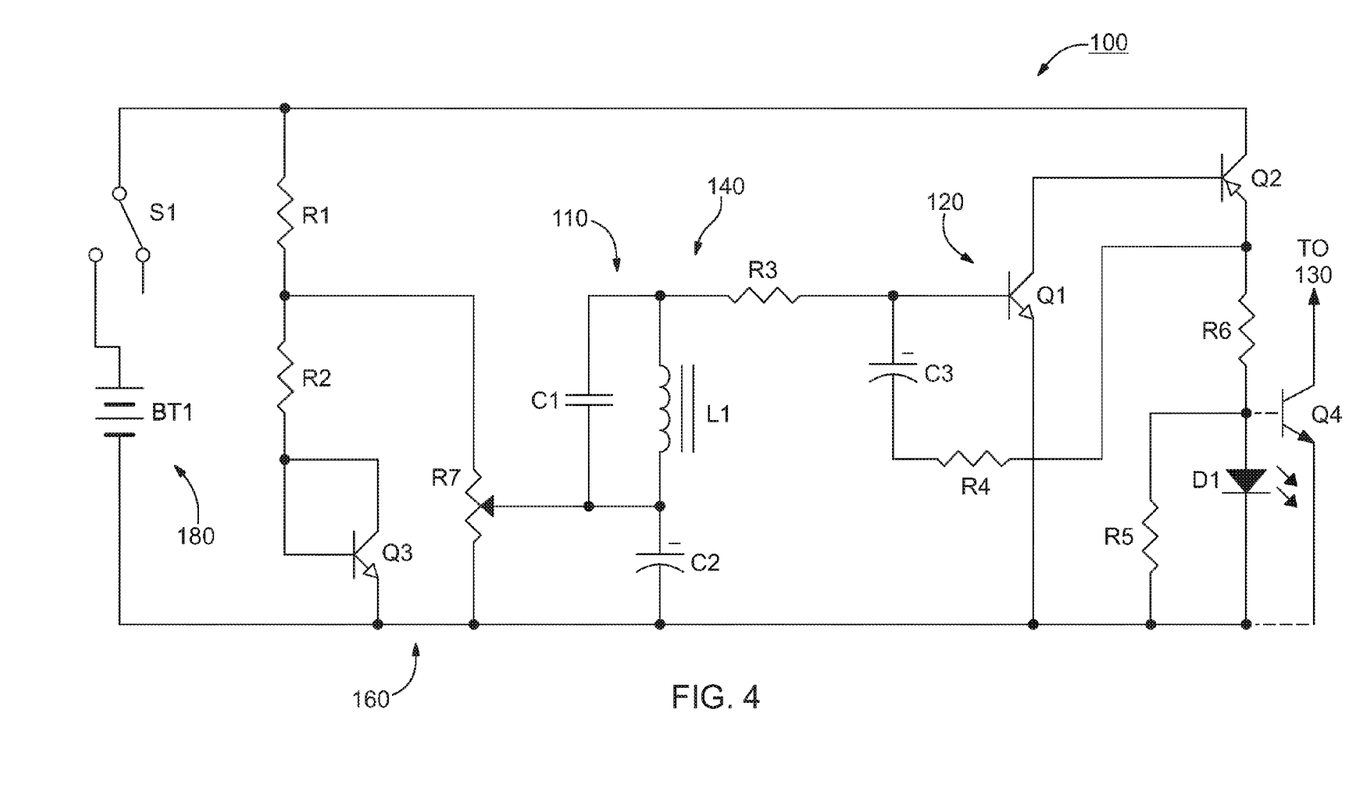
FIG. 4 is an electrical schematic diagram of an example embodiment of an electrical circuit of an electric meter contact arc detector.

FIG. 4 is an electrical schematic diagram of an example embodiment of an electrical circuit of an electric meter contact arc detector 100. The illustrated detector circuit 100 is illustrative of an example embodiment of an electrical arc detector 100 of the sort shown and described in relation to FIG. 3. The electric and/or magnetic fields created by electrical contact arcing impinges upon the tank circuit formed by capacitor C1 and inductor L1, an L-C tank circuit, which is physically located proximate to the site or sites of potential electrical arcing.

Capacitor C1 and inductor L1 comprise a tank circuit 110 or resonant circuit 110 which resonates when excited by energy coupled into it from any nearby alternating magnetic or electric field of sufficient strength and having a frequency within the appropriate range, which is substantially higher than the utility power line frequency, e.g., 60 Hz in the United States and 50 Hz in Europe and elsewhere. Thus, the tank circuit 110 does not respond to the utility power line frequency.

The tank circuit L1-C1 is de-tuned by the resistive load imposed on it via connection to resistor R3 and/or resistors R7, R1, R2 so that it's quality factor Q is reduced and its frequency response or bandwidth is broadened. The DC voltage applied at capacitor C2 is at a DC voltage level that is set by the adjustable potentiometer R7 in cooperation with resistors R1, R2 and diode-connected transistor Q3 to be used (after adjustment) as a predetermined reference or threshold level for detector circuit 120 which is provided by transistors Q1, Q2 for detecting the electric and/or magnetic field created by electric contact arcing.

As ambient temperature changes induce changes in the base-to-emitter voltages Vbe of transistors Q1 and Q3, the amount of thermally induced drift in the two transistors Q1, Q3 is substantially the same if the transistors Q1, Q3 are thermally coupled, as is preferred, and so the effects of temperature change are substantially reduced. Ideally transistors Q3 and Q1 are in the same package, so as to be closely thermally coupled, such as a dual NPN transistor array that is fabricated on a common substrate. The constant voltage on capacitor C2 produces an offset voltage which adds to the signal voltage produced by the tank circuit 110 formed by C1/L1. In practice, potentiometer R7 is set so that the DC voltage at capacitor C2 is just below the threshold which causes transistor Q1 to start conducting.

Transistors Q1, Q2 of detector 120 are preferably interconnected so as to function as a latching circuit. Once transistor Q1 starts to conduct, the base of transistor Q2 is pulled low by the conduction of transistor Q1 to turn transistor Q2 on, whereby current flows out of the emitter of transistor Q2. The portion of that current that flows through the series circuit including resistor R4 and capacitor C3 will provide positive feedback that will tend to turn transistor Q1 on even further. This positive feedback action causes transistors Q1 and Q2 to further turn on until a saturated condition whereby the Q1-Q2 transistor pair are latched in a fully turned on or saturated condition, thereby to provide an output signal from detector 120. Once this conduction commences, it will continue for a time period determined by time constant determined by the values of resistor R4 and capacitor C3. Once triggered, transistor pair Q1-Q2 remain ON until C3 charges completely, thus reducing the feedback current to zero, removing the drive to transistor Q1 so that transistors Q1-Q2 both turn off, terminating the output signal from detector 120.

When transistor Q2 is conducting, an output signal is generated from electric contact arc detector circuit 100 suitable for initiating an action, e.g., signaling for operation of a disconnect switch or interrupter or contactor or circuit breaker, to reduce the electrical current flowing at the site of the electrical arcing thereby to reduce the arcing to a safe level or to extinguish the arcing. Transistors Q1, Q2 thus function as a detector 120 or as a comparator 120 that compares the voltage generated across the de-tuned L-C tank circuit 110 to the reference (or offset) voltage provided by reference source 160.

The signal output from transistors Q1-Q2 of detector 120 may be applied via and/or to different utilization devices, of which two examples are described. In a first example, the turning on of transistor Q2 causes current to flow through the light emitting diode (LED) D1 which illuminates to produce light indicating that a triggering arcing event has occurred, e.g., likely to be arcing at one or more meter connections. While LED D1 may provide a visual indication or warning that arcing has occurred, the light produced thereby may be utilized to impinge upon an opto-electronic device, e.g., a photo-diode, of an optical coupler coupled for initiating operation of an interrupt and/or disconnect device 130.

Alternatively, in another example, output current from transistor Q2 way be applied to turn on a further transistor Q4 which, e.g., directly is coupled to initiate operation of an interrupt and/or disconnect device 130.

The illustrated example circuit 100 of FIG. 4 includes an on/off switch S1 and a battery BT1 for convenience in testing, e.g., testing of circuit 100 and or testing of circuit 100 in an electric meter 20, and one or both thereof would not likely be included in a commercial embodiment of circuit 100. However, in an embodiment of detector 100 configured, e.g., as a portable tester for detecting electrical arcing, then an on/off switch Si and a battery power source 180 would be provided in a housing containing detector 100, and an LED D1 and/or an audible indicator 130 would be provided, e.g., to provide a visual and/or audible indication that the presence of electrical arcing had been detected.

In the illustrated example embodiment, PNP transistor Q2 is intentionally operated in an "inverted" mode wherein the terminal thereof normally serving as the emitter serves as its collector and the terminal thereof normally serving as the collector serves as the emitter, so that the effective current gain (e.g., beta) of transistor Q2 is substantially less than that in normal mode operation. Typically, transistor Q2 when operated in inverted mode exhibits a current gain of about two, which in combination with the normal mode current gain of NPN transistor Q1 provides sufficient gain for the described latching operation of transistors Q1-Q2. A high beta, such as exhibited in normal mode operation of transistors Q1 and Q2, could make the Q1-Q2 latching circuit unstable, e.g., susceptible to oscillating during its turning on (becoming latched) and turning off (becoming unlatched), however, that gain could be attenuated at higher frequencies by employing a small capacitor and/or inductor, e.g., a ferrite bead that slips onto a wire, such as one of the leads of a transistor or another electrical component.

In a typical example embodiment of the detector circuit 100 of FIG. 4, the circuitry is powered by a small 3V DC "coin" cell battery 180, BT1, so that it could easily be fitted into an electric meter without having to modify or connect to the meter's existing electronics. In practice, however, detector circuit 100 would preferably be powered by an existing low voltage DC power supply 180 that is built into the smart meter 20; the additional power drawn from that power supply appears to be negligible. An example parallel LC tank circuit 110 with inductor L1=100 µH and capacitor C1=820 pF provides a calculated resonance frequency of about 560 kHz, and preferably has a relatively broad bandwidth, e.g., preferably in the range of about 10 kHz to several hundred KHz. The value of de-tuning resistor R3, e.g., 100 kilohms, which couples the L1-C1 tank circuit 110 output into the base of transistor Q1 can be determined empirically, e.g., to obtain a desired bandwidth.

In one example, the offset voltage 160 was set about 0.6V, partly to offset a substantial amount of the base-to-emitter threshold voltage Vbe of transistor Q1, so that the voltage generated across the L1-C1 tank circuit 110 by the electric and/or magnetic fields produced by electrical arcing only needed to be around about 20 mV to trigger the Q1-Q2 detector circuit 120 to detect the arcing.

The time duration of the electrical arcing which results in damage to the electric meter 20 varies greatly between electric meters of different configurations and types and between those from different manufacturers, as well as with the material from which meter base 24, and socket base 14, are made. Some electric meters can withstand electrical arcing for more than 10 minutes with minimal damage, and other electric meters can only withstand about 20-30 seconds of electrical arcing before exhibiting visible melting and out-gassing, e.g., of the meter base. Thus, it is preferred that time limits for allowable duration of electrical arcing and delay before initiating a disconnect or interrupt be incorporated into a microcontroller or microprocessor of the metering device 30. Typically, a manufacturer or utility can program the acceptable values for a particular electric meter 20 into the software controlling the microcontroller or microprocessor of metering device 30 thereof so that, e.g., an electrical arc must persist for a predetermined time before the disconnect device 130 is activated.

The timing controlled by the time constant provided by resistor R4 and capacitor C3 is preferably selected to set the minimum pulse width duration at the output of detector circuit 100, 120. The minimum pulse width for each detection should be of sufficient duration to ensure that the micro-controller/microprocessor in the metering device 30 and/or the interrupt or disconnect device 130 will properly and reliably respond to the pulse. Where a visible LED D1 is provided, the minimum pulse width could be selected so that a human observer, e.g., service personnel, could see that the LED illuminates indicating when arcing has occurred.

An electric meter 20 and contact arc detector 100 may comprise: an electric meter base 24 formed of an electrically insulating material and having a plurality of stab contacts 22 configured for making electrical connection to plural contacts 12 of an electric meter socket 10; a metering device 30 supported by the electric meter base 24; and a contact arc detector 100 supported by the electric meter base 24, the contact arc detector 100 may comprise: a de-tuned resonant tank circuit 110 configured to receive a magnetic field and/or an electric field generated by an electrical arc at one or more of the plurality of stab contacts 22; an electrical detector 120 to which the de-tuned resonant tank circuit 110 is coupled for detecting signals generated in the de-tuned resonant tank circuit 110 responsive to the magnetic field and/or an electric field generated by an electrical arc at one or more of the plurality of stab contacts 22; and a disconnect device 130 responsive directly or indirectly to the electrical detector 120 and configured to interrupt an electrical connection to one or more of the plurality of stab contacts 22. An electrical arc at one or more of the plurality of stab contacts 22 may be detected and cause the interruption of an electrical connection to one or more of the plurality of stab contacts 22. The de-tuned resonant tank circuit 110 may include an inductor L and a capacitor C in parallel connection. The de-tuned resonant tank circuit 110 may be coupled to a resistance R for de-tuning the resonant tank circuit 110 to broaden the bandwidth thereof. The electrical detector 120 may have two inputs, a first of the two inputs thereof being coupled to the de-tuned resonant tank circuit 110 and a second of the two inputs thereof being connected to a reference source 160 configured to provide an offset to a detection threshold of the electrical detector 120. The electrical detector 120 may include: a timing network 150 for determining a duration of an output signal therefrom. The timing network 150 may include a resistor R and a capacitor C connected for determining a time constant. The electrical detector 120 may include first and second transistors Q1, Q2, an output electrode of each of the first and second transistors Q1, Q2 being coupled to an input electrode of the other of the first and second transistors Q1, Q2, wherein turning the first transistor Q1 on causes the second transistor Q2 to turn on causing positive feedback 150 to the input electrode of the first transistor Q1, whereby the first and second transistors Q1, Q2 latch into an on condition. The output electrode of the second transistor Q2 may be coupled to the input electrode of the first transistor Q1 by a resistor R and a capacitor C connected for determining a time constant, whereby the first and second transistors Q1, Q2 latch into the on condition for a predetermined time. The electric meter 20 and contact arc detector 100 may further comprise: an optical coupler D1 or a transistor Q4 coupling the electrical detector 120 to the disconnect device 130. The electric meter 20 and contact arc detector 100 may further comprise: a metering device 30 including a micro-controller or a microprocessor, wherein said micro-controller or microprocessor is responsive to said electrical detector 120 to cause said disconnect device 130 to interrupt an electrical connection to one or more of the plurality of stab contacts 22; or to cause the disconnect device 130 to interrupt an electrical connection to one or more of the plurality of stab contacts 22 after the output of the electrical detector 130 persists for a predetermined time.

An electric meter contact arc detector 100 mountable to an electric meter base 24 formed of an electrically insulating material and having a plurality of stab contacts 22 configured for making electrical connection to plural contacts 12 of an electric meter socket 10, and a metering device 30 supported by the electric meter base 24; the contact arc detector 100 may comprise: a de-tuned resonant tank circuit 110 configured to receive a magnetic field and/or an electric field generated by an electrical arc at one or more of the plurality of stab contacts 22; an electrical detector 120 to which the de-tuned resonant tank circuit 110 is coupled for detecting signals generated in the de-tuned resonant tank circuit 110 responsive to the magnetic field and/or an electric field generated by an electrical arc at one or more of the plurality of stab contacts 22; and an output device 30, 130, D1, Q4 responsive to the electrical detector 120 and configured to respond to detection of an electrical arc at one or more of the plurality of stab contacts 22. An electrical arc at one or more of the plurality of stab contacts 22 may be detected and cause the output device 30, 130, D1, Q4 to respond to detection of an electrical arc at one or more of the plurality of stab contacts 22. The de-tuned resonant tank circuit 110 may include an inductor L and a capacitor C in parallel connection. The de-tuned resonant tank circuit 110 may be coupled to a resistance R for de-tuning the resonant tank circuit 110 to broaden the bandwidth thereof. The electrical detector 120 may have two inputs, a first of the two inputs thereof being coupled to the de-tuned resonant tank circuit 110 and a second of the two inputs thereof being connected to a reference source 160 configured to provide an offset to a detection threshold of the electrical detector 120. The electrical detector 120 may include: a timing network 150 for determining a duration of an output signal therefrom. The timing network 150 may include a resistor R and a capacitor C connected for determining a time constant. The electrical detector 120 may include first and second transistors Q1, Q2, an output electrode of each of the first and second transistors Q1, Q2 being coupled to an input electrode of the other of the first and second transistors Q1, Q2, wherein turning the first transistor on causes the second transistor Q2 to turn on causing positive feedback to the input electrode of the first transistor Q1, whereby the first and second transistors Q1, Q2 latch into an on condition. The output electrode of the second transistor Q2 may be coupled to the input electrode of the first transistor Q1 by a resistor R and a capacitor C connected for determining a time constant, whereby the first and second transistors Q1, Q2 latch into the on condition for a predetermined time. The electric meter contact arc detector 100 wherein the output device 130 may include: an audio or visual indicator D1, 130, or a light emitting diode D1 configured to provide an indication that the electrical detector 120 has detected electrical arcing; or an optical coupler D1 or a transistor Q4 or a metering device 30 directly or indirectly coupling the electrical detector 120 to a disconnect device 130 configured to interrupt electrical power to one of more of the plurality of stab contacts 22. The electric meter contact arc detector may further comprise a metering device 30 including a micro-controller or a microprocessor supported by the electric meter base 24, wherein the metering device 30 responds to the output of the electrical detector 120: for activating the output device 130; or for determining a duration of the output of the electrical detector 120; or for activating the output device 130 after the output of the electrical detector 120 persists for a predetermined time.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate"whether or not expressly stated to be such. It is noted that embodiments of very different sizes, shapes and dimensions may employ the described arrangements.

Although terms such as "up," "down," "left," "right," "up," "down," "front," "rear," "side," "end," "top," "bottom," "forward," "backward," "under" and/or "over," "vertical," "horizontal," and the like may be used herein as a convenience in describing one or more embodiments and/or uses of the present arrangement, the articles described may be positioned in any desired orientation and/or may be utilized in any desired position and/or orientation. Such terms of position and/or orientation should be understood as being for convenience only, and not as limiting of the invention as claimed.

As used herein, the term "and/or" encompasses both the conjunctive and the disjunctive cases, so that a phrase in the form "A and/or B" encompasses "A" or "B" or "A and B." In addition, the term "at least one of" one or more elements is intended to include one of any one of the elements, more than one of any of the elements, and two or more of the elements up to and including all of the elements, and so, e.g., the phrase in the form "at least one of A, B and C" includes "A," "B," "C," "A and B," "A and C," "B and C," and "A and B and C."

As used herein, the terms "connected" and "coupled" as well as variations thereof are not intended to be exact synonyms, but to encompass some similar things and some different things. The term "connected" may be used generally to refer to elements that have a direct electrical and/or physical contact to each other, whereas the term "coupled" may be used generally to refer to elements that have an indirect electrical and/or physical contact with each other, e.g., via one or more intermediate elements, so as to cooperate and/or interact with each other, and may include elements in direct contact as well.

A fastener as used herein may include any fastener or other fastening device that may be suitable for the described use, including threaded fasteners, e.g., bolts, screws and driven fasteners, as well as pins, rivets, nails, spikes, barbed fasteners, clips, clamps, nuts, speed nuts, cap nuts, acorn nuts, and the like. Where it is apparent that a fastener would be removable in the usual use of the example embodiment described herein, then removable fasteners would be preferred in such instances. A fastener may also include, where appropriate, other forms of fastening such as a formed head, e.g., a peened or heat formed head, a weld, e.g., a heat weld or ultrasonic weld, a braze, and adhesive, and the like.

The term battery is used herein to refer to an electrochemical device comprising one or more electro-chemical cells and/or fuel cells, and so a battery may include a single cell or plural cells, whether as individual units or as a packaged unit. A battery is one example of a type of an electrical power source suitable for a portable or other device. Such devices could include power sources including, but not limited to, fuel cells, super capacitors, solar cells, and the like. Any of the foregoing may be intended for a single use or for being rechargeable or for both.

Various embodiments of a battery may have one or more battery cells, e.g., one, two, three, four, or five or more battery cells, as may be deemed suitable for any particular device. A battery may employ various types and kinds of battery chemistry types, e.g., a carbon-zinc, alkaline, lead acid, nickel-cadmium (Ni—Cd), nickel-metal-hydride (NIMH) or lithium-ion (Li-Ion) battery type, of a suitable number of cells and cell capacity for providing a desired operating time and/or lifetime for a particular device, and may be intended for a single use or for being rechargeable or for both.

The term DC converter is used herein to refer to any electronic circuit that receives at an input electrical power at one voltage and current level and provides at an output DC electrical power at a different voltage and/or current level. Examples may include a DC-DC converter, an AC-DC converter, a boost converter, a buck converter, a buck-boost converter, a single-ended primary-inductor converter (SEPIC), a series regulating element, a current level regulator, and the like. The input and output thereof may be DC coupled and/or AC coupled, e.g., as by a transformer and/or capacitor. A DC converter may or may not include circuitry for regulating a voltage and/or a current level, e.g., at an output thereof, and may have one or more outputs providing electrical power at different voltage and/or current levels and/or in different forms, e.g., AC or DC.

The term "utility" is used herein in several ways to include all of the recognized uses and definitions of the term. It may be used in relation to a company, corporation, government agency or other entity that supplies and/or controls the supply of a utility, e.g., electrical power, as well as what is supplied, e.g., electricity. The term may also be used in relation to the system, transmission lines, distribution lines, wires, meters, equipment, transformers and the like employed in connection with transmitting and/or delivering the utility to a customer or other user.

While the present invention has been described in terms of the foregoing example embodiments, variations within the scope and spirit of the present invention as defined by the claims following will be apparent to those skilled in the art. For example, the output from detector 100, 120 may be coupled to an LED, or to a utilization device 130, or to both an LED and a utilization device 130. The coupling may be direct, e.g., to an LED D1 that serves as a visual indicator, or indirectly, e.g., via an LED D1 that is part of an optoelectronic coupler that itself is directly coupled to a disconnect device or that is coupled thereto via a micro-controller or microprocessor of an electric meter 20, e.g., of a metering device 30 thereof.

Detector 120 may be implemented by discrete electronic components as illustrated, or may alternatively employ a comparator or high-gain amplifier, e.g., in integrated circuit form, or may be implemented digitally in a micro-controller or microprocessor that is part of a metering device 30 of an electric meter 20.

While certain features may be described as a raised or male feature, e.g., a stab, ridge, boss, flange, projection or other raised or male feature, such feature may be positively formed or may be what remains after a recessed or female feature, e.g., a jaw, groove, slot, hole, indentation, recess or other recessed feature, is made. Similarly, while certain features may be described as a recessed or female feature, e.g., a jaw, groove, slot, hole, indentation, recess or other recessed feature, such feature may be positively formed as a female feature or may be what remains after a raised feature, e.g., a stab, ridge, boss, flange, projection or other raised feature, is made. For example, two closely spaced male features, e.g., stabs similar to stab 22, could define a female feature, e.g., a jaw 12, configured to receive a stab 22 there between.

Preferably the LC tank circuit 110 of detector 100 is located within the housing 24, 28 of electric meter 20, which would typically put the detector tank circuit 110 within about 4 inches (about 10 cm), or less, of all the stabs 22 of the electric meter 20, as illustrated. Alternately, plural detector tank circuits 110 may be employed, so that a separate dedicated detector LC tank circuit 110 could be located more closely to each stab 22, e.g., to each potential arcing location, typically within about 1 inch (about 2.5 cm), or less, of each stab 22. Such plural detector LC tank circuits 110 may be connected in series and coupled to a common detector circuit 120, or may be coupled to separate detector circuits 120.

While the typical electric meters described herein usually have plural stab contacts and the meter sockets described herein usually have plural jaw contacts, the present arrangement is equally suitable for use with electric meters and sockets that have different contact configurations, e.g., an electric meter having plural jaw contacts, a meter socket having plural stab contacts, or an electric meter and meter socket each having various combinations of stabs and jaws, and the terms stab contact and jaw contact in the claims, whether singular or plural, are expressly intended to be so construed.

Each of the U.S. Provisional Applications, U.S. Patent Applications, and/or U.S. Patents, identified herein is hereby incorporated herein by reference in its entirety, for any purpose and for all purposes irrespective of how it may be referred to or described herein.

Finally, numerical values stated are typical or example values, are not limiting values, and do not preclude substantially larger and/or substantially smaller values. Values in any given embodiment may be substantially larger and/or may be substantially smaller than the example or typical values stated.

What is claimed is:

1. An electrical arc detector configured to be placeable proximate one or more series electrical connections, said electrical arc detector comprising:
    an arc detector housing, wherein said arc detector housing renders the electrical arc detector portable and placeable proximate one or more series electrical connections;
    a source of electrical power in said arc detector housing;
    a de-tuned resonant tank circuit supported by said arc detector housing and configured to receive a magnetic field and/or an electric field generated by an electrical arc at a series electrical connection when the magnetic field and/or the electric field impinges upon said resonant tank circuit;
    an electrical detector in said arc detector housing and to which said de-tuned resonant tank circuit is coupled for detecting signals generated in said de-tuned resonant tank circuit responsive to the magnetic field and/or the electric field generated by an electrical arc at the series electrical connection; and
    an output device supported by said arc detector housing, wherein said output device is responsive to said electrical detector and configured to respond to detection of an electrical arc at the series electrical connection by providing a human perceivable indication thereof, whereby an electrical arc at the series electrical connection is detected and causes the output device to respond indicating detection of an electrical arc at the series electrical connection.

2. The electrical arc detector of claim 1 wherein said de-tuned resonant tank circuit includes an inductor and a capacitor in parallel connection.

3. The electrical arc detector of claim 1 wherein said de-tuned resonant tank circuit is coupled to a resistance for de-tuning the resonant tank circuit to broaden the bandwidth thereof.

4. The electrical arc detector of claim 1 wherein said electrical detector has two inputs, a first of the two inputs thereof being coupled to said de-tuned resonant tank circuit and a second of the two inputs thereof being connected to a reference source configured to provide an offset to a detection threshold of said electrical detector.

5. The electrical arc detector of claim 1 wherein said electrical detector includes: a timing network for determining a duration of an output signal therefrom.

6. The electrical arc detector of claim 5 wherein said timing network includes a resistor and a capacitor connected for determining a time constant.

7. The electrical arc detector of claim 1 wherein said electrical detector includes first and second transistors, an output electrode of each of the first and second transistors being coupled to an input electrode of the other of the first and second transistors, wherein turning the first transistor on causes the second transistor to turn on causing positive feedback to the input electrode of the first transistor, whereby the first and second transistors latch into an on condition.

8. The electrical arc detector of claim 7 wherein the output electrode of the second transistor is coupled to the input electrode of the first transistor by a resistor and a capacitor connected for determining a time constant, whereby the first and second transistors latch into the on condition for a predetermined time.

9. The electrical arc detector of claim 1 wherein said output device includes:
    an audio or visual indicator, or a light emitting diode configured to provide an indication that said electrical detector has detected electrical arcing; or
    an optical coupler or a transistor directly or indirectly coupling said electrical detector to the audio or visual indicator, or to the light emitting diode configured to provide an indication that said electrical detector has detected electrical arcing.

10. The electrical arc detector of claim 1 wherein said arc detector housing is configured for said electrical arc detector being disposed:
    adjacent to an electric meter; or
    in an electric meter; or
    in an electric meter proximate a stab contact thereof; or
    in an electric meter socket proximate a jaw contact thereof; or
    in any combination of the foregoing.

11. The electrical arc detector of claim 1 wherein the one or more series electrical connections associated with an electric meter include a stab contact or a jaw contact or both a stab contact and a jaw contact.

* * * * *